United States Patent [19]

Tomari et al.

[11] Patent Number: 5,680,052
[45] Date of Patent: Oct. 21, 1997

[54] FAULT INDICATOR TESTER WITH TEST BAR AND TEST CHAMBER

[75] Inventors: Stephen J. Tomari; John Drew Smith; Kirk E. Moser, all of Albuquerque, N. Mex.

[73] Assignee: Innovative Utility Products Corp., Albuquerque, N. Mex.

[21] Appl. No.: 644,179

[22] Filed: May 10, 1996

[51] Int. Cl.$^6$ .................................................. H01H 31/02
[52] U.S. Cl. ........................... 324/555; 324/423; 324/133; 361/96
[58] Field of Search .................... 324/555, 61, 133, 324/423; 340/410; 361/45, 96

[56] References Cited

U.S. PATENT DOCUMENTS

| | | | |
|---|---|---|---|
| 3,953,797 | 4/1976 | Berard et al. | 324/158 F |
| 4,039,932 | 8/1977 | Duckworth | 324/423 |
| 4,101,826 | 7/1978 | Horsitmann | 324/51 |
| 5,459,630 | 10/1995 | MacKenzie et al. | 361/45 |

OTHER PUBLICATIONS

A.B Chance Co., "Fault Indicators & Instruments", Type SR Secondary Voltage Reset Fault Indicator Oct. 1989, pp. 16–19 & 16–10, Test Tool.

Cooper Power Systems, "Fault Indicators Application Guide",Bulletin 320–05, Test Tool, p. 11, Copyright 1994 Cooper, Jul., 1994.

A.B. Chance Co., "Fault Indicators & Instruments", Quality Assurance Procedures, Oct. 1989, pp. 16–16.

Stephen J. Tomari, "Notes on Patent Search for Fault Indicator Tester" Search from 1995 Sep. 17 thru Oct. 18,UNM Patent Dispository.

*Primary Examiner*—Ernest F. Karlsen
*Assistant Examiner*—Thomas Valone

[57] ABSTRACT

A testing apparatus for testing a sample fault indicator (11) of the type which has a current sensor (15), an automatic reset, an inrush restraint feature, and an indicator display (13) that are widely used by electric utilities for fault location of overhead and underground distribution power circuits. The first objective of the testing apparatus is to test the predetermined current threshold level of the sample fault indicator (11) which is specified by the producer. It provides for the simulation of a fault current condition by means of a pulse driver circuit (99). The output response of properly working fault indicator (11) under this test will cause the indicator display (13) to register a fault state. The second object provided by this apparatus is to test the automatic resetting of the sample fault indicator (11). It provides for simulating a reset signal (105) for a controlled duration of time. A further objective is to test the inrush restraint feature by providing an inrush current simulation, a problem associated with reclosures on power circuits. Testing for inrush restrain shall verify that the sample fault indicator (11) can distinguish between fault currents and inrush currents, thereby preventing a false indication. The apparatus has a test bar (25) means of holding the sample fault indicator within a testing chamber (23) that is under test.

2 Claims, 5 Drawing Sheets

FAULT INDICATOR TESTER WITH TEST BAR AND TEST CHAMBER

BACKGROUND OF INVENTION—FIELD OF INVENTION

This invention relates to a testing method and apparatus for the testing of electrical fault indicators of electrical power circuits, especially fault indicators for high voltage electrical insulated and bare conductors.

BACKGROUND OF INVENTION— DESCRIPTION OF THE BACKGROUND

It is well known that fault indicators are designed to sense an abnormally high magnetic field surrounding a conductor; particularly, when produced by a fault current; after which the fault indicator will visually indicate the fault. To provide the greatest benefit, fault indicators must reliably indicate the fault current which has passed through the power circuit. Also, after the faulted circuit is repaired and the electrical power circuits are restored to normal, properly working automatic resetting fault indicators will cause the visual indicator to display normal.

Generally, utilities specify an inrush restraint feature of the fault indicator to eliminate the event of a false indication from abnormal switching on the power system.

Inrush currents may occur on the power circuits equipped with circuit breakers and reclosure execution, this false indication can confuse the effort in locating the fault. For proficiency, fault indicators are typically specified with this feature in order to distinguish fault currents from inrush currents on those circuits with reclosure action.

U.S. Pat. No. 4,039,932 to Duckworth discloses an apparatus which tests the reaction-time of fault indicators relating to the time required to detect the current surge to the time in which the indicator is displayed. The apparatus implements an interval timer which monitors the time from the initiation of a testing pulse to the time in which an optical sensor detects a display change of the fault indicator. The testing apparatus was designed for fault indicators which applied a mechanical rotor responding to the magnetic field generated from the fault current. Modern fault indicator designs typically are comprised of magnetic reed switches and electronic circuitry which have eliminated the slow reaction time of their predecessors. Unfortunately, the Duckworth devise is limited today since electrical utilities call for testing those modern features which incorporate electronic circuitry. In addition, the Duckworth apparatus fails to incorporate a means of testing the automatic reset features and the inrush restraint options.

U.S. Pat. No. 4,101,826 to Hortismann discloses a fault indicator including a reed relay and further discloses that this equipment can be tested by means of a permanent magnet. This provincial testing method employing a permanent magnet has been used to test the Hortismann and other fault indicators. When the operator places the permanent magnet near the fault indicator, the contacts of a typical magnetic reed switch closes.

The permanent magnet method can never simulate actual fault conditions and is an extremely primitive method. This method obviously has no provisions for testing the inrush restraint option and reset features of fault indicators.

Manually controlled testing techniques are used for testing fault indicators. The conventional approach using a high current test set, normally used for motor overload relays and circuit breakers, is connected to the fault indicator. The current is manually adjusted until a predetermined high current passes through the fault indicator. A determination of the magnitude of the current is necessary to trip the fault indicator so that it indicates the fault. This approach does not simulate actual faulted conditions. The static nature of the current can result in defective fault indicators passing this test and yet not be operating effectively during the transient fault condition. This approach obviously has no provisions for testing either the automatic reset feature or the inrush restraint option of fault indicators.

What is required, therefore, is a method for testing fault indicators which simulates actual power circuit conditions as though the fault current has passed through the fault indicator. A further requirement is a method that simulates conditions that confirm the automatic resetting features of the indicator. An added criteria is a method to simulate actual conditions of inrush current, resulting from power reclosure apparatus, to validate the fault indicator inrush restrain option features. Therefore, what is needed is an apparatus for use in testing which incorporates all the methods above into a single device to completely verify the dependability of the fault indicator.

Objects and Advantages

Accordingly, besides the objects and advantages of the fault indicator tester described in our above patent, several objects and advantages of the patent invention are:

a) to provide a fault indicator tester which shall provide a means to test the predetermined threshold value of the fault indicator. The outputs of the tester, which is a fault signal, can be described as a simulation of a faulted power circuit. The output response of a properly working fault indicator under test shall cause the indicator to display a "FAULT" state as though a faulted current has passed through it;

b) to provide a fault indicator tester as a means to test the automatic reset feature. The reset signal outputs provided by the tester is a selection of the following: 120 volt and 240 volt, electric field voltage, or current; the selection of the tester reset signal output can depend on the users preference of the producers options. The output response of a properly working fault indicator under the automatic reset test shall cause the indicator to change its indicator display from a "FAULT" state to a "NORMAL" state as though the power circuit were returned to normal;

c) to provide a fault indicator tester as a means to test an inrush restraint feature. The inrush signal outputs provided by the tester shall have a magnitude approximate to an inrush current in power circuits which have had circuit breaker and reclosure execution. The inrush restraint feature can distinguish the fault current from the inrush current.

The output response of a properly working fault indicator with inrush restraint feature under test shall prevent the applied signal to display a "FAULT" state;

d) to provide a fault indicator tester as a means to hold the fault indicator which is under test. A pulse conductor, a high voltage lead, and a current lead are connected to the test bar which has conductive sleeves encased in an elongated electrically insulated tube. The test bar is approximately the same size in diameter as a distribution cable;

e) to provide a fault indicator tester a means to test multiple sample fault indicators under simultaneous testing. The elongated test bar shall be sufficiently long to accommodate multiple indicators, actual numbers can be dependent on the physical dimensions of the sample indicators under test. In addition, the tester shall be provided with multiple test bars, typically two test bars, to accommodate multiple rows of fault indicators.

Further objects and advantages are to provide a fault indicator tester that is simple, dependable, and convenient to use in the field and that is inexpensive to manufacture. Furthermore, it shall incorporate all three testing methods into a single device to completely validate the fault indicators prior to the time of installation or periodically after installation as a routine maintenance test. Our invention will become apparent from a consideration of the drawings and ensuing description.

Summary, Ramifications, and Scope

Thus, the reader can see that the fault indicator tester, our invention, provides a portable and reliable, yet inexpensive apparatus that is simple and convenient to use by the utility lineman.

While our above description contains many specificities, these should not be construed as limitations on the scope of the invention, but rather as an exemplification of one preferred embodiment thereof. It will be apparent to those skilled in the art that various modifications and variations can be made in the method of testing of fault indicators of the present invention without departing from the scope or spirit of the invention. Thus, it is intended that the present invention cover the modifications and variations of this invention provided they come within the scope of the appended claims and their equivalents. Furthermore, the fault indicator tester has the additional advantages in that:

it permits an immediate change from relays and relay control logic to a microprocessor and microprocessor control logic;

it allows the fault indicator tester to test radio fault circuit indicator which contain radio transmitter which confirms a fault indication to a radio receiver;

it permits an attachment of an elbow connector such as manufactured by "Elestimold™" for a test point automatic reset feature;

it permits a fourth testing method to verify the reset restraint option which prevents resetting on feedback voltages;

it permits a settable or adjustable value for the current reset signal and the electric field reset signal;

it allows the fault indicator tester to test fault counters;

it permits a second or a multitude of pulse driver circuits for a cycle or a multi-cycle fault component.

Accordingly, the scope of the invention should be determined not by the embodiments illustrated, but by the appended claims and their legal equivalents.

DRAWING FIGURES

In the drawings, closely related figures have the same number but different alphabetic suffixes.

FIG. 3-A is a plot of current verses time depicting an actual reset signal produced by the fault indicator tester simulating a condition after which normal power has been restored.

FIG. 3-B is a plot of current verses time depicting an actual fault signal produced by the fault indicator tester simulating a faulted circuit.

FIG. 3-C is a plot of current verses time depicting an actual inrush signal produced by the fault indicator tester simulating an inrush current.

REFERENCE NUMERALS IN DRAWINGS

| | |
|---|---|
| 11 | sample fault indicator |
| 13 | indicator display |
| 15 | current sensor |
| 17 | field sensor |
| 19 | secondary sensor |
| 21 | electronic circuitry |
| 23 | testing chamber |
| 25 | test bar |
| 27 | power source |
| 29 | safety fuse |
| 31 | on-off switch |
| 33 | stop push button |
| 35 | start push button |
| 37 | mode selector switch |
| 37a | ganged mode selector switch |
| 39 | first relay |
| 39a | contact of first relay |
| 41 | second relay |
| 41a | contact of second relay |
| 41b | contact of second relay |
| 43 | third relay |
| 43a | contact of third relay |
| 43b | contact of third relay |
| 43c | contact of third relay |
| 45 | line lead |
| 47 | neutral lead |
| 48 | chassis ground |
| 49 | one shot timer |
| 49a | rotary selector switch |
| 49b | operational terminal |
| 49c | reset terminal |
| 49d | output terminal |
| 51 | inrush timer |
| 51a | rotary selector switch |
| 51b | on-delay contact |
| 53 | high voltage transformer |
| 55 | 120 volt terminal post |
| 57 | step-up transformer |
| 59 | current transformer |
| 61 | 240 volt terminal post |
| 65 | first resistor |
| 67 | charging resistor |
| 69 | second resistor |
| 71 | third resistor |
| 73 | first capacitor |
| 75 | second capacitor |
| 77 | third capacitor |
| 79 | first diode |
| 81 | second diode |
| 83 | inductor |
| 85 | silicon controlled rectifier |
| 87 | "Zener" diode |
| 89 | settable voltage source |
| 89a | rotary selector switch |
| 91 | current lead |
| 93 | high voltage lead |
| 95 | 120 volt lead |
| 97 | 240 volt lead |
| 99 | pulse driver circuit |
| 101 | pulse conductor |
| 103 | fault signal |
| 105 | reset signal |
| 107 | inrush signal |

-continued

| 109 | fault test position |
| --- | --- |
| 111 | reset test position |
| 113 | inrush test position |
| 115 | pulse component |
| 117 | reset component |
| Tr | reset time |
| Ti | inrush time |
| 119 | hinged cover |
| 121 | instrument case |
| 123 | frame |
| 125 | front panel |
| 127 | first plastic tube |
| 131 | first conductive sleeve |
| 133 | second plastic tube |
| 135 | second conductive sleeve |

Figure 1:
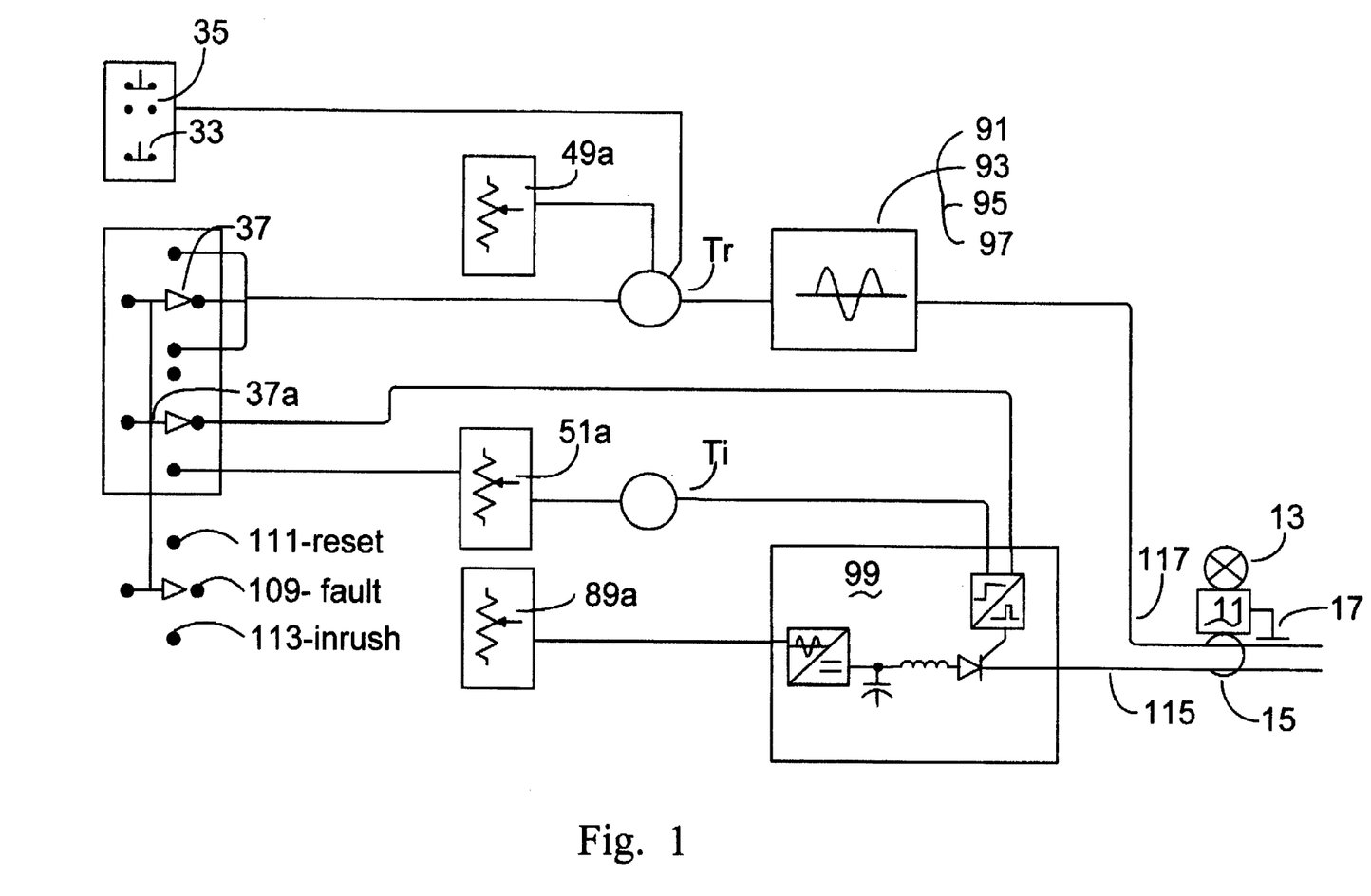
FIG. 1 is a block diagram depicting the overall organization of the apparatus according to the invention and shows a sample fault indicator combined to the apparatus for test.
Figure 2:
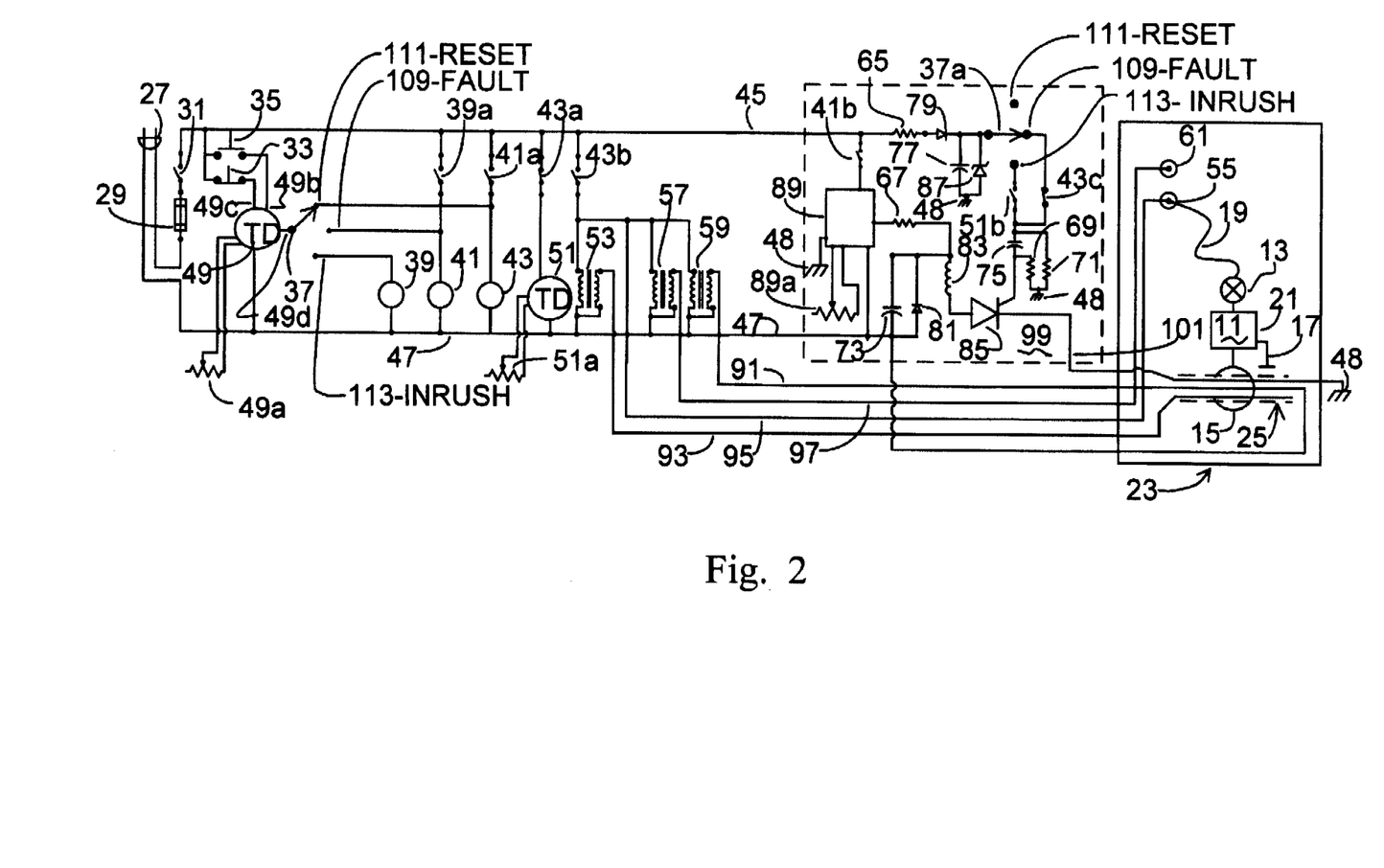
FIG. 2 shows a schematic diagram of an embodiment of an apparatus of the present invention which test fault indicators.
Figure 3:
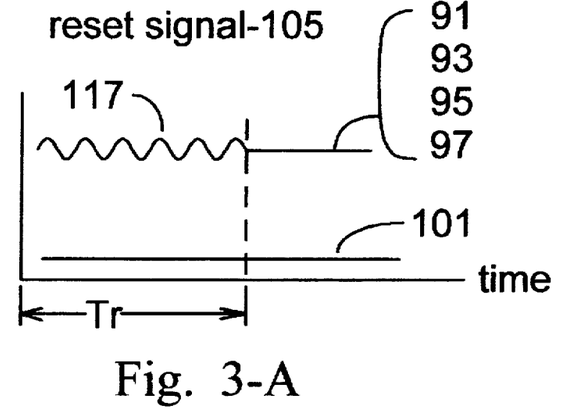

Description FIGS. 1, 2, 3-A, 3-B, 3-C, 4, and 5

In FIG. 1, there is shown a block diagram depiction of a fault indicator tester according to this invention that is simulating tests on a sample fault indicator 11. The description of the fault indicator tester refers to the single fault indicator as shown in FIG. 1. However, testing could comprise of multiple fault indicators 11 of the same specifications using a test bar 25 as described in more detail below.

Consider FIG. 2, schematic diagram that illustrates one embodiment of the present invention that is well suited for testing fault indicators 11. A safety fuse 29 is connected to a power source 27 which supplies 120 volts at 60 hertz. The opposite end of safety fuse 29 is attached to an on-off switch 31. Then the opposite end of on-off switch 31 is joined to a line lead 45 which is the control source for the fault indicator tester. The opposite end of power source 27 signal path is connected to a neutral lead 47 that supplies a common control path for the fault indicator tester.

A start push button 35, normally opened, is connected to line lead 45 and the opposite end is connected to an operational terminal 49b of a one shot timer 49. A stop push button 33, which is normally closed, is joined to line lead 45 and the opposite end is attached to a reset terminal 49c. An output terminal 49d provides a signal path and is connected to a rotational contact terminal of a mode selector switch 37. A common terminal of one shot timer 49 is connected to neutral lead 47. The time duration function of one shot timer 49 is to be provided by a rotary selector switch 49a and is to be positioned for the timing control. Commonly, rotary selector switch 49a selects discrete resistive values that predetermine the time duration of the one shot timer.
Description Furthermore, rotary selector switch 49a and one shot timer 49 provide for a reset time Tr of a reset component 117. Reset time Tr and reset component 117 are shown in FIGS. 3-A, 3-B, and 3-C and described in more detail below. Typically, rotary selector switch 49a will be mounted on a control panel with other operational switches. Whereby, control leads from rotary selector switch 49a are connected to the proper input terminals of one shot timer 49.

Mode selector switch 37 and a ganged mode selector switch 37a share a common mechanical shaft and have an electrical circuit of a double pole with three positions. Accordingly, switch 37 and 37a provides for control of the three testing modes. The three testing modes are: a reset test position 111 were the object is to apply a reset signal 105; a fault test position 109 were the object is to apply a fault signal 103; and, an inrush test position 113 were the object is to apply an inrush signal 107. The purpose of selector switch 37 and 37a is for the operator to select a testing mode and apply the selected test on the sample fault indicator.

When mode selector switch 37 is placed in the reset test position, a signal flow path is provided to a third relay 43. By which third relay 43 is energized through the time control of the one shot timer. When third relay 43 is on, a contact 43b, normally open, closes activating the circuitry for reset component 117. Contacts 43b is connected to line lead 45 and the opposite end is joined to: a primary connection of a high voltage transformer 53; a primary connection of a step-up transformer 57, a primary connection of a current transformer 59, and a 120 volt lead 95. A secondary terminal of high voltage transformer 53 becomes a signal source and is connected to a high voltage lead 93.

The opposite ends of a primary coil and a secondary coil of high voltage transformer 53 and neutral lead 47 are joined. A secondary terminal of step-up transformer 57 becomes a signal source and is connected to a 240 volt lead 97. The opposite ends of a primary coil and a secondary coil of step-up transformer 57 and neutral lead 47 are joined. Finally, a secondary terminal of current transformer 59 becomes a signal source and is connected to a current lead 91. The opposite ends of a primary coil and a secondary coil of current transformer 59 are joined to the neutral lead. These circuits are the sources of the reset component of the reset signal shown in detail in FIG. 3-A and its operation is described in more detail below.

Ganged mode selector switch 37a and the reset test position 111 is shown in FIG. 2. A signal flow path is incomplete to a gate firing circuit of a silicon controlled rectifier 85. Accordingly, the reset signal does not provide for a pulse component 115 in this mode.

Consider FIG. 2, when switch 37 is selected to fault test position 109 a signal flow path is provided to a second relay 41. Under which, relay 41 is energized through the time control of the one shot timer. When second relay 41 is on, a contact 41a, normally open, closes thereby energizing third relay 43. By which normally open contact 43b closes, providing the signal path flow to the circuitry for reset component 117 which is required for fault signal 103. The circuitry for the reset component is described in more detail above. And, reset component 117 of the fault signal is illustrated in FIG. 3-B and its operation is explained below.

FIG. 2 shows ganged mode selector switch 37a and fault test position 109.

The signal path flow can be completed between the line lead and the gate electrode of the silicon controlled rectifier by closure of a contact 43c. The third relay is on and the normally closed contact 43c is opened. Third relay 43 is energized through the contact of fault test position 109 and by the time control of one shot timer. When one shot timer 49 ends its time function, relay 43 is denergized, closing contact 43c. The closure of contact 43c will instantaneously complete the firing signal circuit, and supply a turn on signal to the gate electrode of the silicon controlled rectifier. Details regarding the description of the preferred embodiments of the silicon controlled rectifier and the pulse driver circuit are more fully described next. It is also noted that when switch 37a is in the fault test position, it allows a signal flow path through contact 43c only.

Consider FIG. 2, the pulse driver circuit schematic diagram illustrates one embodiment that is well suited for the present invention. The function of the pulse driver circuit is to provide pulse component 115 of fault signal 103 that is shown in FIG. 3-B and its operation is described below. Pulse driver circuit 99 comprises of a contact 41b normally open connected to line lead 45. The opposite end of contact 41b is connected to a first input terminal of a settable voltage source 89. A second input terminal of settable voltage source 89 is connected to neutral lead 47. Settable voltage source 89 is a direct current regulated voltage source that is commonly used for a capacitor charging circuit. During the fault testing mode described above, second relay 41 is on. By closing contacts 41b, it provides a signal path to the input of settable voltage source 89. A charging resistor 67 is connected to a first positive output of the settable voltage source.

And, the opposite end of charging resistor 67 is connected to: a first capacitor 73, a second diode 81, and an inductor 83. Settable voltage source 89 provides for the charging current path to first capacitor 73 through charging resistor 67. First capacitor 73 and second diode 81 are connected in parallel and their opposite ends are connected to neutral lead 47. A second negative output of settable voltage source 89 is connected to a chassis ground 48. The opposite end of inductor 83 is connected to an anode electrode of silicon control rectifier 85. The opposite end of silicon controlled rectifier 85, a cathode electrode, is connected to a pulse conductor 101. Operation of the settable voltage source 89 is to be provided by a rotary selector switch 89a. Rotary selector switch 89a is to be selected for a voltage setting control that determines a magnitude of the pulse component of fault signal 103. Commonly, rotary selector switch 89a selects discrete resistive values that predetermine the voltage magnitude output of source 89 and therefore the control of the magnitude of the pulse component. Typically, switch 89a is mounted on the control panel with other operational switches, then control leads from switch 89a are connected to the proper input terminals of source 89. In addition to the above description, the second function of the pulse driver circuit is to provide the pulse component of the inrush signal. That is shown in FIG. 3-C and its description and operation is characterized below.

The function of the gate circuitry shown in FIG. 2 is to initiate a firing signal to the gate electrode by which the silicon controlled rectifier turns on and becomes conductive. A first resistor 65 is connected to line lead 45 and the opposite end is connected in series with an anode electrode of a first diode 79.

The opposite end of a cathode of first diode 79 is connected to a third capacitor 77, a cathode electrode of a "zener" diode 87, and a rotational contact terminal of switch 37a. The opposite ends of third capacitor 77 and an anode of "zener" diode 87 are joined to chassis ground 48. On-delay contact 51b is connected to a stationary contact of inrush test position 113. And, contact 43c is connected to a stationary contact of fault test position 109 as depicted on switch 37a of FIG. 2-B. The opposite ends of contact 43c and on-delay contact 51b are joined providing a signal flow path to a second capacitor 75 and a third resistor 71. The opposite end of third resistor 71 is connected to chassis ground 48. Opposite end of second capacitor 75 is joined to a second resistor 69 and the gate electrode of silicon controlled rectifier 85. Finally, the opposite end of second resistor 69 is connected to chassis ground 48. The first signal flow path is controlled by the selection of fault test position 109 and the closure of contact 43c. The second signal flow path is provided by the controls of inrush test position 113 selection and the delayed closure of on-delay contact 51b. The gate circuitry of the silicon controlled rectifier described above is one embodiment of the present invention that completes the task of providing for the firing signal to the gate electrode.

Consider FIG. 2, when mode selector switch is placed in the inrush test position a signal flow path is provided to a first relay 39. Under which, relay 39 is energized through the time control of one shot timer 49. When relay 39 is on, a contact 39a that is normally open, closes energizing second relay 41. Normally open contact 41a closes; by which the third relay is sealed on through closed contact 41a.

When relay 43 energizes, normally open contact 43b closes, thereby providing the signal flow path for the reset component circuitry which is required for the inrush signal. The circuitry for the reset component is described in detail above.

A contact 43a, which is normally closed, is connected to the line lead and the opposite end is connected to a first terminal of an inrush timer 51. A common terminal of inrush timer 51 is connected to the neutral lead. Accordingly, normally closed contacts 43a opens and releases the time control of inrush timer 51.

When the ganged mode selector switch is placed in the inrush test position 113, a signal flow path can be completed by closure of on-delay contact 51b between line lead 45 and the gate electrode of silicon controlled rectifier 85. Relay 39 is energized through the time control of one shot timer 49. When one shot timer 49 terminates its time function, relay 39 is denergized, opening contact 39a. The opening of contact 39a turns off second relay 41; then contact 41a will open which finally release relay 43. Contact 43b, which provides a signal path flow to the reset circuitry, opens ending the reset component. The closure of contact 43a will activate the on-delay timer 51. By which, on-delay contact 51b will close after a duration of an inrush time Ti has been completed. At the end of this time function, inrush time Ti shall initiate the firing signal circuit, and supply a turn on signal to the gate electrode. The gate circuitry is explained above in more detail. The time duration control of inrush timer 51 is to be provided by a rotary selector switch 51a. Rotary selector switch 51a and inrush timer 51 provides for controlled time duration before the initiation of pulse component 115. Inrush time Ti of pulse component 115 is shown in detail in FIG. 3-C and its operation is described below.

Rotary selector switch 51a selects discrete resistive values that predetermine the on-delay of contact 51b. Typically, rotary selector switch 51a will be mounted on a control panel with other operational switches. By which control leads from rotary selector switch 51a are connected to the proper input terminals of inrush timer 51.

Figure 5:
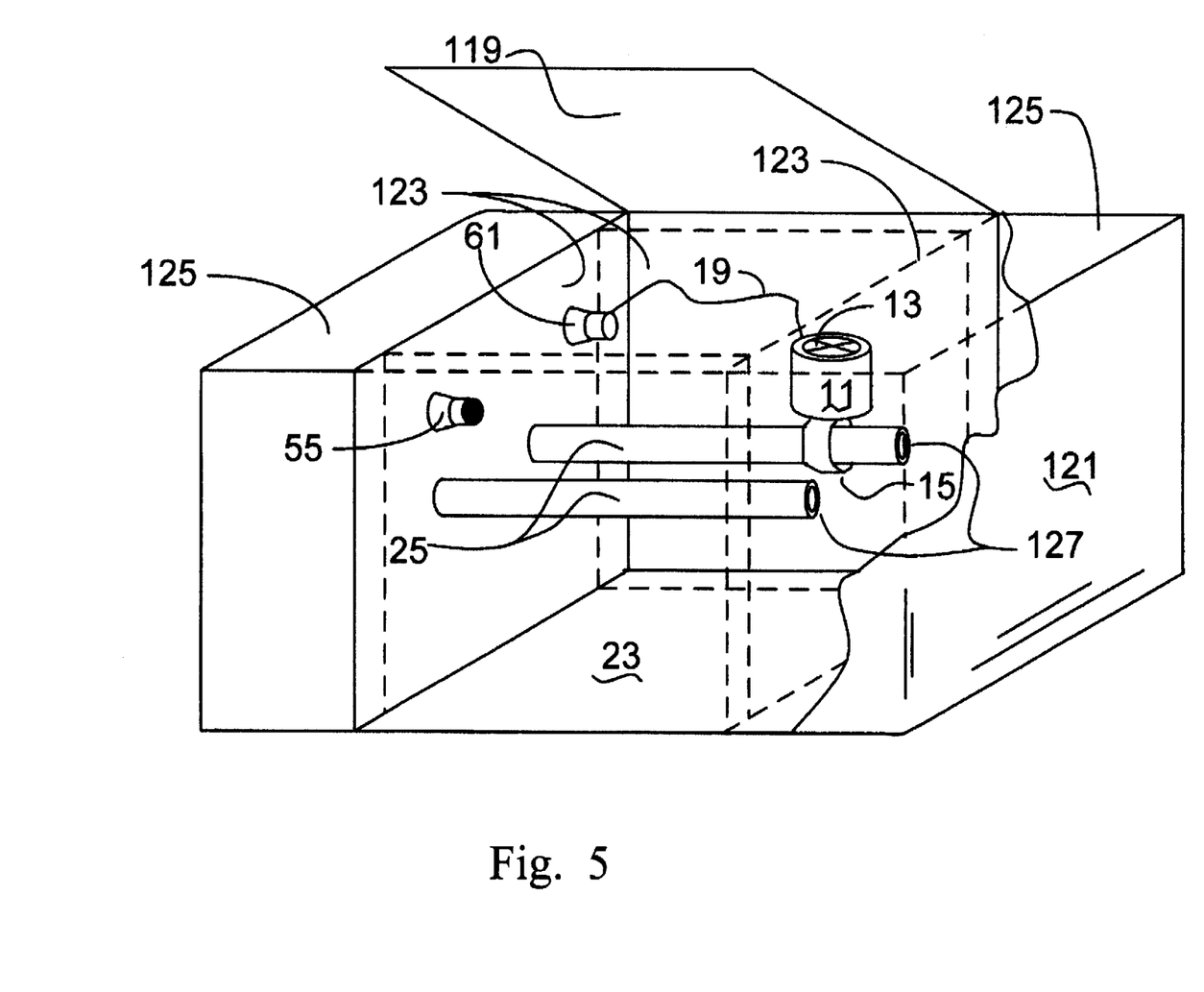
FIG. 5 is a fragmentary side cross-sectional view showing the instrument case while illustrating the testing chamber assembly.

The inventive features of the fault indicator tester are electrical in nature and the housing for the fault indicator tester is not dealt with in detail. Only in general, the housing for the fault indicator tester is a basic instrument case 121. FIG. 5 shows testing chamber 23 which consists of a frame 123 fabricated, preferably, from panel grade aluminum sheets. The inside dimensions of testing chamber 23 are typically 9 inches wide by 11 inches deep by 8 inches high. The interior space that is created by the frame and the instrument case provides for the various electronic and control relay components. Whereby, the components are mounted to the outside frame of the testing chamber. The final assembly is fitted and fastened into the instrument case. The fault indicator tester shall include a front panel 125, preferably, panel grade aluminum sheet, which shall support various mode switches, push buttons, and operational switches.

FIG. 5 shows a typical embodiment of testing chamber 23, test bars 25, a 120 volt terminal post 55, and a 240 volt terminal post 61 that provide the testing space and components for applying a test or a series of tests to the sample fault indicator. By which indicator 11 is mounted and tested on test bar 25 within the chamber 23 of the fault indicator tester according to this invention. FIG. 5 shows two test bars 25 positioned inside the testing chamber 23. The test bars are mounted on frame 123 that form the sides of the testing chamber.

Accordingly, a multitude of sample fault indicators 11 having the same specification can be tested. The 240 volt terminal post and 120 volt terminal post are mounted on the inside wall of the testing chamber 23. Whereby, terminal posts 55 and 61 are accessible for the attachment of a secondary sensor 19 from the sample indicator. A hinged cover 119 for the testing chamber 23 is, preferably, fabricated from transparent-rigid material such as plastic. Hinged cover 119 permits access to the chamber 23 for installation and removal of indicator 11. The transparent guard allows the operator to observe and verify an indicator display 13 of the fault indicator during various testing modes.

Figure 4:
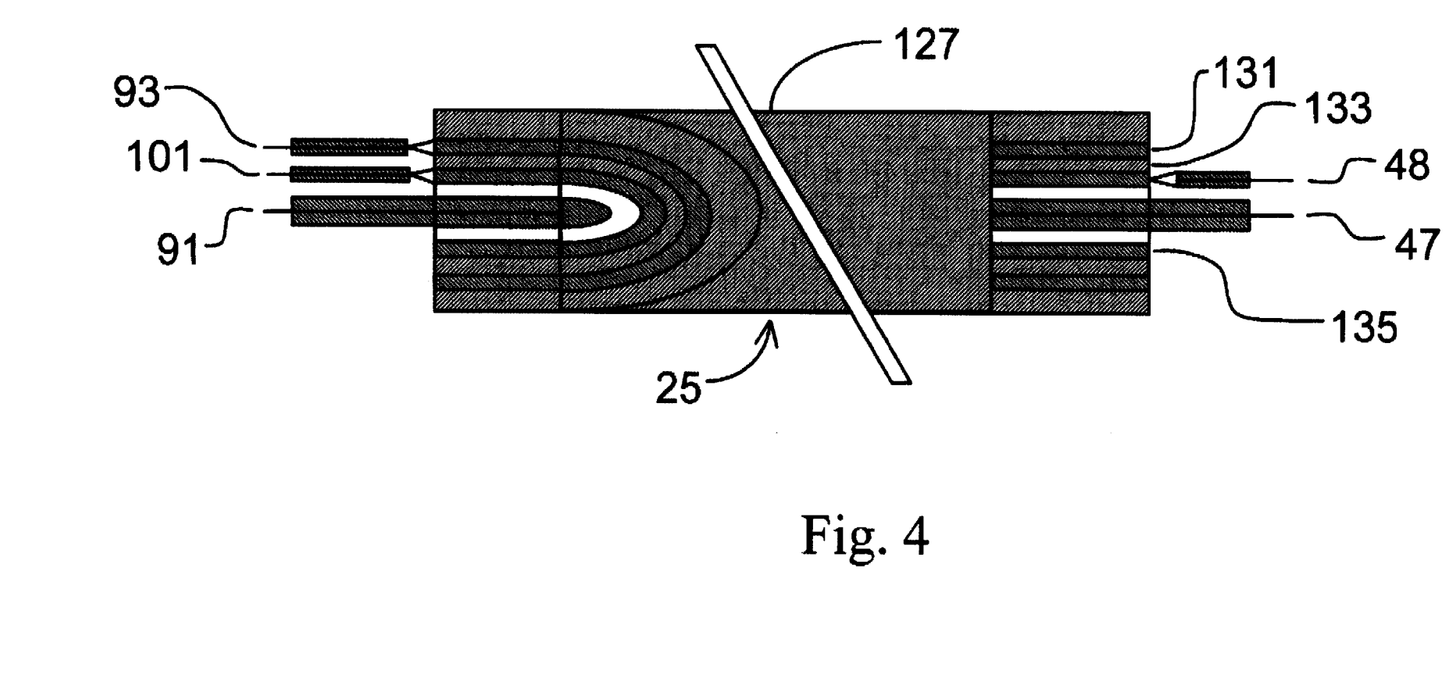
FIG. 4 are partial cross-sectional views of a test bar assembly according to the present invention.

FIG. 4, a view with cross-section lines of test bar 25 shows a first plastic tube 127, typically five-eights to seven-eights of an inch diameter, elongated "PVC" tube that forms an outer structure. The test bar's diameter approximates that of a distribution cable to which fault indicators 11 are normally attached. Test bar 25 is positioned in testing chamber 23 and is about nine inches long which length allows mounting of multiple indicators 11. A first conductive sleeve 131, preferably composed of brass tubing, is fabricated to fit securely into the inside center space of first plastic tube 127. By this construction, the test bar will establish a symmetrical radial electric field to be sensed by the indicators under test. High voltage lead 93 that provides the high voltage reset component is joined to first conductive sleeve 131. A second plastic tube 133, preferably "PVC" tubing, is assembled to fit firmly into the inside center area of the first conductive sleeve 131. A second conductive sleeve 135, typically one-quarter of an inch copper tubing, will be fitted firmly into second plastic tube 133.

Pulse conductor 101 is connected to second conductive sleeve 135 and the opposite end is joined to chassis ground 48. The test bar by this construction will establish a magnetic field from a pulse component that will have precise concentric field lines to be sensed by the mounted indicators. Finally, current lead 91, typically a 16-gauge wire with thermoplastic insulation, is positioned into the center space of second conductive sleeve 135. By this assembly, the test bar will establish the current reset component to be sensed by the mounted indicator.

Operation-FIGS. 2, 3-A, 3-B, and 3-C

Consider FIG. 2, a block diagram illustration of a sample fault indicator 11. The fault indicator comprises of an indicator display 13, a current sensor 15, a field sensor 17, an electronic circuitry 21, and a secondary sensor 19. Typically, indicators 11 will display a normal state, by a letter "N" with a white or a black background. Then, indicators 11 will register a fault state, by displaying a letter "F" with a red or an orange color background or by displaying a flashing light.

In FIG. 2, there is a depiction of the fault indicator with automatic resetting sensors. Commonly, automatic resetting sensors are available from one of four options from the producers; that is: secondary sensors 19, shown with a "pig tail" lead, which detects 120 or 240 volts; field sensor 17 which detects the presents of a high voltage field, and, current sensor 15 which senses the presents of a minimum current. Generally, utilities specify an inrush restraint feature to the fault indicator. By which, electronic circuitry 21 eliminates the events of a false indication from abnormal reclosure operation on the power circuit.

Operation

For an operator to use the fault indicator tester, the tester should be placed on a flat, secure table. The operator should place an on-off switch 31 in the off position; then preferably, a power line cord is used to connect the tester to a power source 27. The operator should proceed by opening a hinged cover 119 to a testing chamber 23 and mount the sample fault indicator on a test bar 25. Indicators 11 with secondary sensor 19 are joined to the appropriate terminal post 55 or 61. After indicator 11 is mounted, the hinged cover shall be closed.

The energization of a line lead 45 is controlled by the operation of an on-off switch 31. The operation of the fault indicator tester is to be provided by a start push button 35, when push button 35 is closed by its depression, an one shot timer 49 begins its timing function. In the event, one wishes to stop or reset the operation, by depressing a stop push button 33 the circuit path is interrupted to one shot timer 49 and is reset.

A reset signal 105 is shown in FIG. 3-A where reference numerals 91, 93, 95, and 97 signal leads show a respective reset component 117. Four signal leads are required to synthesize a reset signal 105 because of the variety of the producers options. The user will predetermine the duration of a reset time Tr by positioning a rotary selector switch 49a to the specified value provided by the producer. Settable values of reset time Tr are typically: 30 seconds, 45 seconds, 1 minute, 3 minutes, 5 minutes, 10 minutes, 15 minutes, 20 minutes, 30 minutes, 45 minutes, and 60 minutes. From the selection of reset signals and from the range of reset times Tr which are available on the fault indicator tester, the user can apply a specific reset test to a variety of fault indicators 11.

To begin the reset test on the sample indicator, indicator display 13 should be in the fault state. To register a fault state, the operator can apply the fault test which operation is described below. Indicator 11 is placed in testing chamber 23 and mounted on a test bar 25. The operator positions a mode selector switch 37 and a ganged mode selector switch 37a in a reset test position 111. And, selects reset time Tr by positioning rotary selector switch 49a. On-off switch 31 is placed in the "ON" position and the operator depresses start push button 35. The fault indicator tester initiates an output reset signal 105 that is sensed by the fault indicator. The response of a properly working unit under the reset test will cause the fault indicator to change its display from the fault state to the normal state.

Consider FIG. 3-B that shows reference numerals 91, 93, 95, and 97 leads and their respective reset component 117 of a fault signal 103. Furthermore, the choice of the position of rotary selector switch 49a will predetermine the duration of reset time Tr. In addition, FIG. 3-B shows pulse conductor 101 and its respective pulse component 115 of the fault signal. The fault indicator tester provides for settable magnitudes of a pulse component 115 by the positioning of a rotary selector switch 89a. This selection will predetermine the current magnitude required to operate the threshold level of the fault indicator. Suited values of the current magnitude are typically selected from: 100 amperes, 200 amperes, 300 amperes, 400 amperes, 500 amperes, 600 amperes, 700 amperes, 800 amperes, 900 amperes, 1000 amperes, and 1200 amperes.

To begin the fault test on the sample fault indicator, indicator display 13 should be in the normal state.

To register a normal state, the operator can apply the reset test which operation is described above. The fault indicator is placed in testing chamber 23 and mounted on the test bar. The operator positions switch 37 and 37a in a fault test position 109 and selects reset time Tr by positioning rotary selector switch 49a. The user must then select the current magnitude by positioning switch 89a to the desired value. The on-off switch is placed in the "ON" position and the operator depresses start push button 35. The fault indicator tester initiates the output of the fault signal sensed by the fault indicator. The response of a properly working unit under the fault test will cause the fault indicator to change its display from the normal state to the fault state.

An Inrush signal 107 is shown in FIG. 3-C where reference numerals 91, 93, 95, and 97 leads and their respective reset component 117. Furthermore, the choice of the position of rotary selector switch 49a will predetermine the duration of reset time Tr. Also, FIG. 3-C illustrates pulse conductor 101 and its respective pulse component 115 of the inrush signal. The fault indicator tester provides for settable magnitudes of the pulse component by the selection of switch 89a. The user will then predetermine the duration of an inrush time Ti by positioning a rotary selector switch 51a. Settable values of inrush time Ti are typically: 100 milliseconds, 200 milliseconds, 300 milliseconds, 400 milliseconds, and 500 milliseconds.

To begin the fault test on the sample fault indicator, indicator display 13 should be in the normal state. To register a normal state, the operator can apply the reset test which operation is described above. The fault indicator is placed in testing chamber 23 and mounted on the test bar.

The operator positions switch 37 and 37a in inrush test position 113 then selects reset time Tr by positioning rotary selector switch 49a. And, selects inrush time Ti by positioning rotary selector switch 51a. The user must then select the current magnitude by positioning switch 89a to the desired value. The on-off switch is placed in the "ON" position and the operator depresses start push button 35. The fault indicator tester initiates the output of inrush signal 107 that shall be sensed by the fault indicator. The response of a properly working unit under the inrush test will cause the fault indicator to remain in the normal state. Furthermore, a properly working fault indicator 11 that has an inrush restrain features will distinguish the fault current from the inrush magnetizing currents in a power circuit.

It will be apparent to those skilled in the art that various modifications and variations can be made in the method of testing of fault indicators of the present invention without departing from the scope or spirit of the invention. Thus, it is intended that the present invention cover the modifications and variations of this invention provided they come within the scope of the appended claims and their equivalents.

We claim:

1. Test apparatus for testing a fault indicator of the type which has a current sensor, automatic reset, and inrush restraint, and an indicator display for fault location of overhead and underground distribution power circuits comprising:

a) a test chamber having a mounting frame and AC electrical voltage terminal post, b) a test bar within the test chamber upon which one or more said fault indicators may be mounted for testing, c) a fault current simulator having a pulse driver circuit the pulse driver circuit producing a current having a settable magnitude level in a range that includes the predetermined current threshold level of said fault indicator, d) a reset signal circuit with time duration control means for applying a reset signal to the fault indicator, and e) an inrush signal circuit with inrush time duration control means for applying an inrush signal to the fault indicator.

2. Test apparatus of claim 1 wherein said test bar contains two cylindrical plastic tubes and two electrically conductive cylindrical sleeves, of differing diameters so that said tubes and said sleeves are alternately mounted and are concentric to each other.

\* \* \* \* \*